(12) United States Patent
Ohnuma et al.

(10) Patent No.: US 7,507,617 B2
(45) Date of Patent: Mar. 24, 2009

(54) METHOD FOR MANUFACTURING SEMICONDUCTOR DEVICE

(75) Inventors: Hideto Ohnuma, Kanagawa (JP); Kouki Inoue, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 361 days.

(21) Appl. No.: 11/012,172

(22) Filed: Dec. 16, 2004

(65) Prior Publication Data

US 2006/0134891 A1 Jun. 22, 2006

(30) Foreign Application Priority Data

Dec. 25, 2003 (JP) ............................. 2003-431369

(51) Int. Cl.
*H01L 21/84* (2006.01)
(52) U.S. Cl. .............................. 438/166; 257/E21.561
(58) Field of Classification Search ......... 438/151–166; 257/E21.561
See application file for complete search history.

(56) References Cited

U.S. PATENT DOCUMENTS

| | | | |
|---|---|---|---|
| 4,886,765 A * | 12/1989 | Chen et al. ................. 438/301 |
| 5,514,610 A * | 5/1996 | Wann et al. ................. 438/278 |
| 5,543,352 A | 8/1996 | Ohtani et al. |
| 5,789,284 A | 8/1998 | Yamazaki et al. |
| 5,849,643 A * | 12/1998 | Gilmer et al. ............... 438/773 |
| 5,879,977 A | 3/1999 | Zhang et al. |
| 6,015,724 A | 1/2000 | Yamazaki |
| 6,027,960 A | 2/2000 | Kusumoto et al. |
| 6,071,766 A | 6/2000 | Yamazaki et al. |
| 6,117,796 A | 9/2000 | Gale et al. |
| 6,180,439 B1 | 1/2001 | Yamazaki et al. |
| 6,331,457 B1 | 12/2001 | Yamazaki et al. |
| 6,337,229 B1 | 1/2002 | Yamazaki et al. |
| 6,337,235 B1 | 1/2002 | Miyanaga et al. |
| 6,355,509 B1 | 3/2002 | Yamazaki |
| 6,368,904 B1 | 4/2002 | Yamazaki |
| 6,380,007 B1 | 4/2002 | Koyama |
| 6,383,852 B2 | 5/2002 | Zhang et al. |
| 6,399,454 B1 | 6/2002 | Yamazaki |
| 6,426,276 B1 | 7/2002 | Ohnuma et al. |

(Continued)

FOREIGN PATENT DOCUMENTS

CN 1131342 9/1996

(Continued)

OTHER PUBLICATIONS

Office Action (Application No. 200410104859.3; CN6691 Dated Oct. 12, 2007) With Full English translation.

*Primary Examiner*—Richard A. Booth
(74) *Attorney, Agent, or Firm*—Nixon Peabody LLP; Jeffrey L. Costellia

(57) ABSTRACT

An object of the present invention is to provide a method for manufacturing a semiconductor device in which, after crystallizing by using an element that promotes crystallization, holes are prevented from being generated in a crystalline semiconductor film with a concentration of the element in the crystalline semiconductor film decreased by performing gettering. To solve the problem, as a feature of the structure of the invention, in the case of removing a silicon oxide film formed over the semiconductor film, an etchant made of a solution containing fluorine and a substance having surface activity is used.

28 Claims, 6 Drawing Sheets

U.S. PATENT DOCUMENTS

| | | |
|---|---|---|
| 6,432,756 B1 | 8/2002 | Ohtani et al. |
| 6,433,363 B1 | 8/2002 | Yamazaki et al. |
| 6,451,638 B1 | 9/2002 | Zhang et al. |
| 6,461,943 B1 | 10/2002 | Yamazaki et al. |
| 6,489,189 B2 | 12/2002 | Yamazaki et al. |
| 6,544,826 B1 | 4/2003 | Yamazaki et al. |
| 6,620,711 B2 | 9/2003 | Yamazaki |
| 6,624,049 B1 | 9/2003 | Yamazaki |
| RE38,266 E | 10/2003 | Yamazaki et al. |
| 6,664,144 B2 | 12/2003 | Nakajima et al. |
| 6,670,225 B2 | 12/2003 | Ohnuma |
| 6,713,323 B2 | 3/2004 | Yamazaki et al. |
| 6,727,124 B2 | 4/2004 | Nakajima et al. |
| 6,743,700 B2 | 6/2004 | Asami et al. |
| 6,756,608 B2 | 6/2004 | Kasahara et al. |
| 2001/0036692 A1 | 11/2001 | Yamazaki et al. |
| 2001/0038090 A1 | 11/2001 | Rasmussen et al. |
| 2005/0142702 A1 | 6/2005 | Ohnuma et al. |
| 2006/0183276 A1* | 8/2006 | Yamazaki et al. ........... 438/166 |

FOREIGN PATENT DOCUMENTS

| | | |
|---|---|---|
| JP | 08-213316 | 8/1996 |

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device, more specifically, a method for manufacturing a semiconductor device in which holes (cavities, pores or the like) are prevented from being generated in a crystalline semiconductor film.

2. Description of the Related Art

There is a method for manufacturing a semiconductor film including amorphous silicon having preferable properties by using an element which promotes crystallization as a method for forming a crystalline semiconductor film including silicon at low temperature and in short time. (See Reference 1: Japanese Patent Laid-Open No. H8-213316)

In this method, an amorphous silicon film is formed over a glass substrate, then a film including nickel is formed over the amorphous silicon film, and the amorphous silicon film is crystallized by heating. Accordingly, a crystalline silicon film is obtained.

Then, an amorphous silicon film is further formed through an oxide film that serves as an etching stopper over the crystalline silicon film, and heat treatment is again carried out. Accordingly, the nickel element is diffused into the amorphous silicon film from the crystalline silicon film, thereby decreasing the concentration of nickel in the crystalline silicon film.

The amorphous silicon film into which the nickel element is diffused is removed; however, an oxide film is formed over the surface by being heated during the crystallization. Therefore, the amorphous silicon film is removed after the oxide film is removed using hydrofluoric acid, and further, the oxide film serving as an etching stopper is removed. Accordingly, a crystalline silicon film having preferable properties can be obtained.

According to this method, a crystalline silicon film can be rapidly obtained at low temperature. Furthermore, concentration of nickel in the crystalline silicon film can be reduced.

The crystalline silicon film thus manufactured can be preferably used for a thin film transistor and a capacitor.

SUMMARY OF THE INVENTION

Even after gettering carried out on a crystalline silicon film which is crystallized using an element that promotes crystallization, since heat is added when gettering is carried out, a natural oxide film 505 of FIG. 5 is formed over an amorphous silicon film 504 (also there is a case that the amorphous silicon film is partially crystallized. The amorphous silicon film 504 is hereinafter referred to as a gettering site) to which an element promoting crystallization moves. The gettering site 504 is to be removed as described above, however, when the crystalline silicon film 507 is formed being in contact with the gettering site 504, the crystalline silicon film 507 is also removed by an etchant used in the case of removing the gettering site 504 since silicon is a main constituent both in the crystalline silicon film 507 and the gettering site 504. In order to prevent this, an etching stopper 503 including a silicon oxide film is formed between the crystalline silicon film 507 and the gettering site 504.

The gettering site and the silicon oxide film are removed in the following steps. When the oxide film is removed by using hydrofluoric acid or buffer hydrofluoric acid, sometimes there are holes in the crystalline silicon film in some places.

The crystalline silicon film is used as an active layer or a capacitor of a thin film transistor. When there are holes in the crystalline semiconductor layer, coatability of a gate insulating film which is formed thereafter becomes worse. Consequently, leakage current or withstand voltage defect is generated. Thus, it is an object of the present invention to provide an etching method to prevent such holes from being generated and a manufacturing method of a semiconductor device.

As a means for solving these problems, according to one structure of the invention, an etchant made from a solution containing fluorine and a substance having surface activity is used when a silicon oxide film formed over a semiconductor film including silicon (such as a silicon film) is removed.

By applying this structure, even if a substance having high etching rate to a solution including fluorine is segregated in the silicon film, only the silicon oxide film can be selectively removed since the substance having surface activity is included. Accordingly, holes can be prevented from being generated in the silicon film.

As a feature of another structure of the invention, a silicon oxide film is formed over a crystalline silicon film crystallized by using an element that promotes crystallization, an amorphous silicon film is formed over the silicon oxide film, and heat treatment is carried out. Accordingly, the element that promotes the crystallization is moved to the amorphous silicon film, and a silicon oxide film formed over the amorphous silicon film is removed by using an etchant made from a solution containing fluorine and a substance having surface activity.

According to this structure, even if the element that promotes crystallization and the compound of the element that promotes crystallization and silicon are segregated in the amorphous silicon film, since the substance having surface activity is included, only the silicon oxide film can be removed with high selectivity, holes can be prevented from being generated in the amorphous silicon film. Consequently, holes are prevented from generated in the silicon film.

As a feature of another structure of the invention, in the above-mentioned structure, after removing the silicon oxide film formed over the amorphous silicon film, the amorphous silicon film is removed, and the silicon oxide film formed over the crystalline silicon film is removed by using an etchant made from a solution containing fluorine and a substance having surface activity.

As a feature of another structure of the invention, when a silicon oxide film formed over a crystalline silicon film crystallized by using an element that promotes crystallization is removed, an etchant made from a solution containing fluorine and a substance having surface activity is used.

As a feature of another structure of the invention, when a crystalline silicon film crystallized by using an element that promotes crystallization is irradiated with electromagnetic energy such as laser light, a silicon oxide film formed over the crystalline silicon film is removed by using an etchant made from a solution containing fluorine and a substance having surface activity.

As a feature of another structure of the invention, when a semiconductor device using a crystalline silicon film crystallized by using an element that promotes crystallization is manufactured, a silicon oxide film formed over the crystalline silicon film is removed by using an etchant made from a solution containing fluorine and a substance having surface activity before forming a gate insulating film.

As a feature of another structure of the invention, before carrying out channel doping on a crystalline silicon film crystallized by using an element that promotes crystallization, a silicon oxide film formed over the crystalline silicon film is removed by using an etchant made from a solution containing fluorine and a substance having a surface activity.

As a feature of another structure of the invention, a manufacturing method of a semiconductor device includes the steps of processing a crystalline silicon film crystallized by using an element that promotes crystallization into a desired shape, and forming an insulating layer formed of a silicon oxide film by covering the crystalline silicon film, in which an etchant made from a solution including fluorine and a substance having surface activity is used when an opening is provided for the insulating layer to electrically conduct the silicon oxide film.

According to the structure, even if an element that promotes crystallization and a compound of the element that promotes crystallization and fluorine are segregated in a crystalline silicon film, only the silicon oxide film can be removed with high selectivity since a substance having surface activity is included, and holes can be prevented from being generated in the crystalline silicon film.

As a feature of another structure of the invention, in the above-mentioned structure, the semiconductor device is a thin film transistor.

As a feature of another structure of the invention, in the above-mentioned structure, the semiconductor device is a capacitor.

As a feature of another structure of the invention, in the above-mentioned structure, the substance having surface activity is an organic solvent.

As a feature of another structure of the invention, in the above-mentioned structure, the substance having the surface activity is a surface active agent.

As a feature of another structure of the invention, in the above-mentioned structure, the substance having the surface activity is an organic acid.

As a feature of another structure of the invention, in the above-mentioned structure, the substance having surface activity is a surface active agent and an organic solvent.

As a feature of another structure of the invention, in the above structure, the substance having the surface activity is an organic solvent and an organic acid.

As a feature of another structure of the invention, in the above-mentioned structure, the solution including fluorine is hydrofluoric acid.

As a feature of another structure of the invention, in the above-mentioned structure, the solution including fluorine is a mixed solution of hydrofluoric acid and ammonium fluoride.

As a feature of another structure of the invention, in the above-mentioned structure, the etchant made from a solution containing fluorine and a substance having a surface activity is a solution containing a surface active agent and fluorine of which pH is 5 or more, more preferably 5.5 or more.

As a feature of one structure of the invention, a method for manufacturing a semiconductor device comprises the steps of: irradiating a crystalline semiconductor film comprising silicon crystallized by using an element that promotes crystallization with laser light; and removing a silicon oxide film formed over the surface of the crystalline semiconductor film with the irradiation of the laser light by using a solution containing fluorine and a substance having surface activity As a feature of one structure of the invention, a method for manufacturing a semiconductor device comprises the steps of: forming a first silicon oxide film over a first crystalline semiconductor film crystallized by using an element that promotes crystallization, the first crystalline semiconductor film comprising silicon; forming a second semiconductor film comprising amorphous silicon over the first silicon oxide film; performing a heat treatment wherein a second silicon oxide film is formed on the second semiconductor film; and removing the second silicon oxide film by using a solution containing fluorine and a substance having surface activity.

As a feature of one structure of the invention, a method for manufacturing a semiconductor device comprising the steps of: forming a first silicon oxide film over a first crystalline semiconductor film crystallized by using an element that promotes crystallization, the first crystalline semiconductor film comprising silicon; forming a second semiconductor film comprising amorphous silicon over the first silicon oxide film; performing a heat treatment; removing the second semiconductor film; and removing the first silicon oxide film formed over the first crystalline semiconductor film by using a solution containing fluorine and a substance having surface activity.

As a feature of one structure of the invention, a method for manufacturing a semiconductor device comprising the steps of: irradiating a first crystalline semiconductor film crystallized by using an element that promotes crystallization with laser light, the first crystalline semiconductor film comprising silicon; removing a first silicon oxide film formed on the surface of the first crystalline semiconductor film with the irradiation of the laser light by using a solution containing fluorine and a substance showing having surface activity; forming a second silicon oxide film over the first crystalline semiconductor film; forming a second semiconductor film comprising amorphous silicon over the second silicon oxide film; performing a heat treatment wherein a third silicon oxide film is formed on the second semiconductor film; and removing the third silicon oxide film by using a solution containing fluorine and a substance having surface activity.

As a feature of one structure of the invention, a method for manufacturing a semiconductor device comprising the steps of: irradiating a first crystalline semiconductor film crystallized by using an element that promotes crystallization with laser light, the first crystalline semiconductor film comprising silicon; removing a first silicon oxide film formed on the surface of the first crystalline semiconductor film with the irradiation of the laser light by using a solution containing fluorine and a substance showing having surface activity; forming a second silicon oxide film over the first crystalline semiconductor film; forming a second semiconductor silicon film comprising amorphous silicon over the second silicon oxide film; performing a heat treatment; removing the second semiconductor film; and removing the second silicon oxide film formed over the first crystalline semiconductor film by using a solution containing fluorine and a substance having surface activity.

As a feature of one structure of the invention, a method for manufacturing a semiconductor device comprising the steps of: forming a first silicon oxide film over a first crystalline semiconductor film crystallized by using an element that promotes crystallization, the first crystalline semiconductor film comprising silicon; forming a second semiconductor film comprising amorphous silicon over the first silicon oxide film; performing a heat treatment wherein a second silicon oxide film is formed on the second semiconductor film; and removing the second silicon oxide film by using a solution containing fluorine and a substance having surface activity removing the second semiconductor film; and removing the first silicon oxide film formed over the first crystalline semiconductor film by using a solution containing fluorine and a substance having surface activity.

As a feature of one structure of the invention, a method for manufacturing a semiconductor device comprising the steps of: irradiating a first crystalline semiconductor film crystallized by using an element that promotes crystallization with laser light, the first crystalline semiconductor film comprising silicon; removing a first silicon oxide film formed on the surface of the first crystalline semiconductor film with the irradiation of the laser light by using a solution containing fluorine and a substance having surface activity; forming a second silicon oxide film over the first crystalline semiconductor film; forming a second semiconductor film comprising amorphous silicon over the second silicon oxide film; performing a heat treatment wherein a third silicon oxide film is formed on the second semiconductor film; and removing the third silicon oxide film by using a solution containing fluorine and a substance having surface activity; removing the second semiconductor film; and removing the second silicon oxide film formed over the first crystalline semiconductor film by using a solution containing fluorine and a substance having surface activity.

As a feature of one structure of the invention, a method for manufacturing a semiconductor device comprising the steps of: patterning a first crystalline semiconductor film crystallized by using an element that promotes crystallization to obtain a desired-shape, the first crystalline semiconductor film comprising silicon; removing a first silicon oxide film formed on the surface of the first crystalline semiconductor film by using a solution containing fluorine and a substance having surface activity; and forming a gate insulating film by covering the first crystalline semiconductor film.

As a feature of another structure of the invention, a method for manufacturing a semiconductor device comprising the steps of: forming a first crystalline semiconductor film crystallized by using an element that promotes crystallization, the first crystalline semiconductor film comprising silicon; removing a first silicon oxide film formed on a surface of the first crystalline semiconductor film by using a solution containing fluorine and a substance having surface activity; forming a second silicon oxide film on the surface of the first crystalline semiconductor film; introducing impurities to control a threshold value of the semiconductor device, and forming a thin film transistor.

As a feature of another structure of the invention, a method for manufacturing a semiconductor device comprising the steps of: forming a first crystalline semiconductor film crystallized by using an element that promotes crystallization, the first crystalline semiconductor film comprising silicon; forming a contact hole in an insulating film covering the first crystalline semiconductor film; removing a first silicon oxide film formed on a surface of the first crystalline semiconductor film in the contact hole by using a solution containing fluorine and a substance having surface activity, and forming a metal wiring connected to the first crystalline semiconductor film.

A feature of another structure according to the above structure is the method for manufacturing a semiconductor device, wherein the substance having surface activity is one or more kinds of organic solvent, organic acid, and a surface active agent.

A feature of another structure according to the above structure is the method for manufacturing a semiconductor device, wherein the solution containing fluorine is a solution containing hydrofluoric acid.

A feature of another structure according to the above structure is the method for manufacturing a semiconductor device, wherein the solution containing fluorine is a solution containing hydrofluoric acid and ammonium fluoride.

A feature of another structure according to the above structure is the method for manufacturing a semiconductor device, wherein pH of the solution containing fluorine and surface active agent is 5 or more.

A feature of another structure according to the above structure is the method for manufacturing a semiconductor device, wherein pH of the solution containing fluorine and surface active agent is 5.5 or more.

According to the invention, holes which penetrate a semiconductor film can be prevented from being generated. As a result holes of a crystalline semiconductor film can be controlled. Consequently, coatability defect of a gate insulating film in a thin film transistor formed using the crystalline semiconductor film and in a capacitor can be prevented, occurrence of a defect of withstand voltage and leakage current can be controlled, and a defect resulted therefrom can be reduced. Therefore, a yield and reliability can be improved.

The reliability and the yield of an element having semiconductor properties that is at the heart of a semiconductor device and a light emitting device manufactured by applying the invention are improved. Therefore a low-cost and high-reliable device can be obtained.

DETAILED DESCRIPTION OF THE INVENTION

Embodiment Mode 1

Embodiment mode of the present invention is hereinafter described with reference to drawings. It is to be understood by those of skilled in the art that the invention can be applied in various modes, and the mode and the detail can be variously changed unless it departs from the content and the scope of the invention. The invention is not limited to the description of this embodiment mode.

In this embodiment, a method for preventing holes from being generated on a surface of a crystalline silicon film in the case of removing an etching stopper composed of a silicon oxide film formed on the surface of the crystalline silicon film during guttering, and a natural oxide film (silicon oxide film) formed on a gettering site composed of an amorphous silicon film formed on the etching stopper is described with reference to FIGS. 1A to 1G.

Figure 1A:
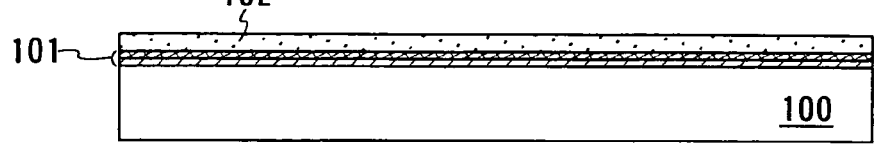
FIGS. 1A to 1G show Embodiment Mode 1.

First, an amorphous silicon film is formed after forming a base insulating film 101 over a substrate 100 and crystallized using an element that promotes crystallization, thereby forming a crystalline silicon film 102 (FIG. 1A).

As the substrate 100, a glass substrate, a quartz substrate, an insulating substrate such as crystalline glass, a ceramic substrate, a stainless-steel substrate, a metal substrate (tantalum, tungsten, molybdenum, or the like), a semiconductor substrate, a plastic substrate (polyimide, acrylic, polyethylene terephthalate, polycarbonate, polyarylate, polyethersulfone, or the like), or the like can be used. However, the material which can at least withstand heat generated in the process is to be used. In this embodiment, a glass substrate is used.

The base film 101 is provided so as to prevent alkali metal or alkaline earth metal in the substrate 100 from diffusing into the crystalline silicon film 102. This is because those elements have an adverse affect on semiconductor properties of the crystalline silicon film. As the material, silicon oxide, silicon nitride, silicon nitride oxide, and silicon oxynitride can be used. The base film 101 is formed in a single layer or in a laminated structure thereof. Note that it is not necessary to provide a base insulating film in case a substrate of which alkali metal or alkaline earth metal are does not diffuse is used.

In this embodiment, the base insulating film 101 is manufactured in a laminated structure using a silicon nitride oxide film which is 50 nm in thickness as a first insulating film, and a silicon oxynitride film which is 100 nm in thickness as a second insulating film. Note that the difference of the silicon nitride oxide film and the silicon oxynitride film is the ratio of nitride to oxide. The former indicates that the content of nitrogen is higher than the latter. The base film of the first layer is formed using $SiH_4$, $N_2O$, $NH_3$, or $H_2$ as a source gas, in a pressure of 0.3 Torr, a RF power of 50 W, a RF frequency of 60 MHz, and a substrate temperature of 400° C., by plasma CVD. The base film of the second layer is formed using $SiH_4$ or $N_2O$ as a source gas, in a pressure of 0.3 Torr, a RF power of 150 W, a RF frequency of 60 MHz, and a substrate temperature of 400° C., similarly by plasma CVD.

Then, an amorphous silicon film is formed over the base insulating film with a thickness of 25 nm to 100 nm (preferably, 30 nm to 60 nm). A known manufacturing method such as sputtering, low pressure CVD, or plasma CVD can be used as the manufacturing method. In this embodiment mode, the amorphous silicon film is formed with a thickness of 50 nm by plasma CVD.

Then, crystallization of the amorphous silicon film is performed. Heat treatment is performed by using an element that promotes crystallization of the amorphous silicon film. As the typical example of the element that promotes the crystallization, nickel is given. The crystallization is performed at a lower temperature and in shorter time by using the element than the case in which the element is not used. Thus, the element is preferably used in the case of using a substrate such as a glass substrate which is comparatively weak against heat. As the element that promotes the crystallization in this manner, iron, palladium, tin, lead, cobalt, platinum, copper, gold or the like can be given besides nickel. One kind or a plurality of kinds of the elements can be used.

As the method to add the element, there is a method in which salt as the element is dissolved in a solvent and applied by spin coating or dipping. An organic solvent, water or the like can be used for the solvent; however, since the solution is directly touched over the silicon film, it is important to select the solution that does not affect the semiconductor properties. It is similar to the case of salt.

An example of using Ni as the element that promotes crystallization is described in this embodiment mode. Ni is preferably used as a nickel acetate solution or nickel nitrate solution including 10-ppm nickel. The water solution is applied to the surface of the amorphous silicon film by spin coating. There is possibility that the solution cannot be applied uniformly since the surface of the silicon film has hydrophobic properties. Therefore the surface of the amorphous silicon film is preferably processed with ozone water in advance to form an extremely thin silicon oxide film.

It can be considered that ion implantation, heating in a steam atmosphere including Ni, and sputtering using an Ni material as a target or the like is used as a method to add the element that promotes crystallization to the amorphous silicon film.

Subsequently, the amorphous silicon film is crystallized by performing heat treatment. It may be carried out at 500° C. to 650° C. for about from 1 minute to 24 hours since a catalytic element is used. The amorphous silicon film is crystallized to be a crystalline silicon film 102 by this crystallization treatment. At this time, the amorphous silicon film may be crystallized by applying magnetic field also using the magnetic energy, or using high output microwave. In this embodiment mode, the crystalline silicon film 102 is formed by performing heat treatment at 550° C. for 4 hours after heat treatment with a vertical furnace at 550° C.

Then, crystallization is performed by using a laser and the crystallinity is improved by reducing defects in the crystalline silicon film 102. As a laser oscillation device for the laser crystallization, a pulse oscillation, or a continuous oscillation gas or solid state and a metal laser oscillation device may be used. As a gas laser, excimer laser, Ar laser, Kr laser or the like may be used, while as a solid state laser, YAG laser, $YVO_4$ laser, YLF laser, $YAlO_3$ laser, glass laser, ruby laser, alexandrite laser, or sapphire laser may be used, and as a metal laser, helium cadmium laser, copper steam laser, gold steam laser may be used. As a crystal which is a laser medium of the solid state laser, one or more selected from $Cr^{3+}$, $Cr^{4+}$, $Nd^{3+}$, $Er^{3+}$, $Ce^{3+}$, $Co^{2+}$, $Ti^{3+}$, and $Yb^{3+}$, or $V^{3+}$ is doped as an impurity.

A laser oscillated from the laser oscillation device is preferably irradiated in a linear shape by using an optical system. The linear laser can be obtained by using a typical cylindrical lens or a concave mirror. As the irradiation condition, the laser may be irradiated with the power density in the range of about 0.01 to 100 $MW/cm^2$ in an atmosphere, an atmosphere in which oxygen concentration is controlled, an $N_2$ atmosphere, or in vacuum. Further, in the case of using a pulse oscillation laser, it is desirable that the laser energy density be from 100 to 1500 $mJ/cm^2$ (typically from 200 to 500 $mJ/cm^2$) with a frequency of 30 Hz to 300 Hz. At this time, the laser light may be calculated with FWHM of laser light to overlap from 50% to 98%. Note that the crystallization is carried out under an atmosphere in this embodiment.

When the laser irradiation is performed in an atmosphere, the silicon oxide film that is a natural oxide film is formed over the crystalline silicon film 102. However, it is desirable to remove the silicon oxide film since its film quality cannot be controlled.

At this time, in the case of using a solution containing fluorine and a substance is having surface activity, even if there is segregation of nickel and/or nickel silicide in the crystalline silicon film 102 that is located in a lower part of the layers, only the silicon oxide film can be selectively etched, thereby preventing holes from being generated in the crystalline silicon film 102. As an example for the solution containing fluorine and a substance having surface activity, a solution including approximately 0.3 wt % of HF, approximately 40 wt % of $NH_4F$, approximately 0.01 to 0.1 wt % of surface active agent, or a solution including approximately 0.01 wt % of HF, approximately 17 wt % of $NH_4F$, approximately 0.01 to 0.1 wt % of surface active agent can be given. Without applying this composition, a solution including HF, $NH_4F$, and a surface active agent; a solution including HF and a surface active agent in which pH is 5, preferably 5.5 or more; a solution including HF and an organic solvent; a solution including HF and organic acid; a solution including HF, a surface active agent, and an organic solvent; a solution including HF, a surface active agent, and organic acid, or the like can be used. Note that etching may be performed at a room temperature. Although the processing time depends on the thickness or the quality of the oxide film, the etching may be performed for about 45 seconds.

As the substance having surface activity, an organic solvent, organic acid, a surface active agent or the like can be given as described above, and one of or a plurality of them are used. The pH of the etchant including the surface activity is preferably 5 or more, preferably, 5.5 or more.

Figure 1B:
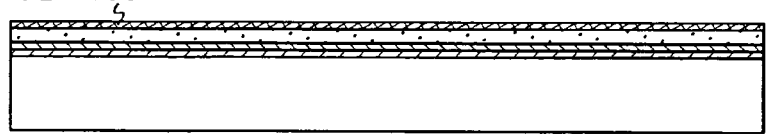
Figure 1C:
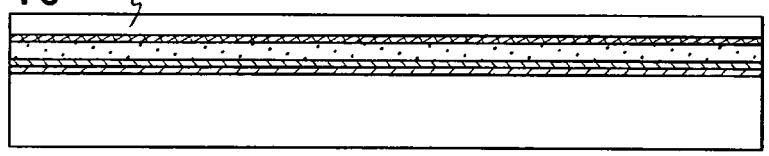

Subsequently, a silicon oxide film 103 is formed over the crystalline silicon film (FIG. 1B). The silicon oxide film 103 is formed by irradiating with UV radiation in oxygen atmosphere, a thermal oxidation method, processing using ozone water or hydrogen peroxide, or the like. Then, a gettering site is formed by sputtering or CVD method. In the case of forming by sputtering, the guttering site 104 is formed by depositing an amorphous silicon film including an argon element with a thickness of 50 nm. The deposition condition is set as follows: deposition pressure of 0.3 Pa, gas (Ar) flow rate of 50 sccm, deposition power of 3 kW, a substrate temperature of 150° C. (FIG. 1C). Note that atomic concentration of argon element and oxide included in the amorphous silicon film in the above condition are approximately $3 \times 10^{20}/cm^3$ to $6 \times 10^{20}/cm^3$ and $1 \times 10^{19}/cm^3$ to $3 \times 10^{19}/cm^3$, respectively. Then, heat treatment at 650° C. for 3 minutes using rapid annealing device is carried out to perform gettering.

Figure 1D:
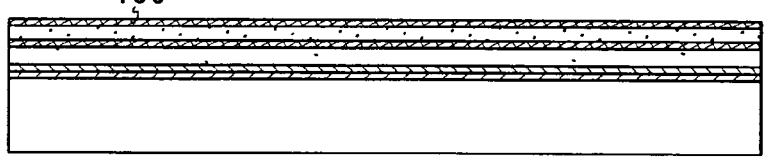

By performing the heat treatment, at least one part of an element that promotes crystallization in the crystalline silicon film 102 is moved to a gettering site 104. A natural oxide film 105 composed of a silicon oxide film is formed over the gettering site 104 according to the heat treatment (FIG. 1D).

Figure 1E:
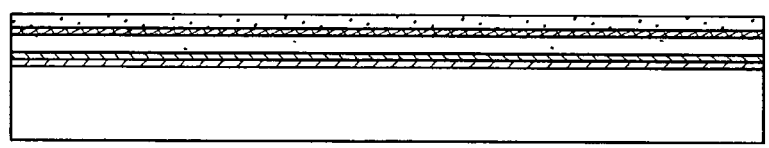

Then, the natural oxide film 105 is removed using a solution containing fluorine and a substance having surface activity. By using the mixture solution of a solution including fluorine and a solution including a substance having surface activity, even if there is segregation of nickel and/or nickel silicide in the gettering site 104 therebelow, only the natural oxide film 105 composed of a silicon oxide film can be selectively etched. Thus, occurrence of holes in the gettering site 104 and the etching stopper 103 therebelow can be reduced (FIG. 1E).

As an example of the solution containing fluorine and a substance having surface activity, a solution including approximately 0.3 wt % of HF, approximately 40 wt % of $NH_4F$, and approximately 0.01 to 0.1 wt % of a surface active agent; or a solution including approximately 0.1 wt % of HF, approximately 17 wt % of $NH_4F$, or approximately 0.01 to 0.1 wt % of a surface active agent can be noted. Without using this composition, a solution including HF, $NH_4F$, and a surface active agent; a solution including HF and a surface active agent with pH of 5 or more, preferably pH of 5.5 or more; a solution including HF and an organic solvent; a solution including HF and organic acid; a solution including HF, a surface active agent and an organic solvent; a solution including HF, a surface active agent, and organic acid, or the like can be used. Note that etching is performed at a room temperature for approximately 55 seconds of processing time.

As a substance having surface activity, an organic solvent, organic acid and a surface active agent are noted as described, and one kind of or a plurality of them are used. The pH of an etchant including the surface activity is preferably 5 or more, preferably, 5.5 or more.

Figure 1F:
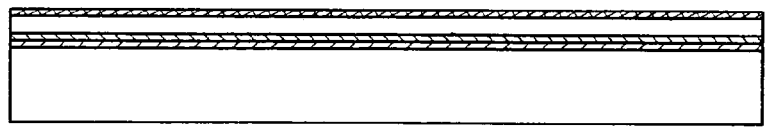

Then, the gettering site 104 is heated at approximately 60° C. using a solution including TMAH (Tetra methyl ammonium hydroxide), and etched. Since the etching stopper 103 is a silicon oxide film, etching rate of the etchant including TMAH is small. Thus, the guttering site 104 that is a silicon film can be selectively etched (FIG. 1F).

At this time, in the case where the natural oxide film 105 is removed by a solution containing fluorine and a substance having surface activity as described, even if there is segregation of nickel and/or nickel silicide in the gettering site 104, holes can be prevented. Since holes in the etching stopper can be prevented, the crystalline silicon film 102 is not exposed to TMAH, and generation of holes can be prevented.

Then, the etching stopper 103 is etched using the solution containing fluorine and a substance having surface activity, as is the case of etching the natural oxide film 105. Though an etching stopper is not a natural oxide film, the etching stopper 103 is desirably removed since a large amount of nickel may be included in the silicon oxide film used as the etching stopper of getting and it may cause deterioration of the active layer according the subsequent steps.

By using the solution containing fluorine and a substance having surface activity, even if there is segregation of nickel and/or nickel silicide, only the etching stopper 103 composed of a silicon oxide film can be selectively etched. Thus, holes are prevented from being generated in the crystalline silicon film 102.

As an example of the solution containing fluorine and a substance having surface activity, a solution including approximately 0.3 wt % of HF, approximately 40 wt % of $NH_4F$, and approximately 0.02 wt % of a fluorine-based surface active agent, and a solution including approximately 0.1 wt % of HF, approximately 17 wt % of $NH_4F$, and approximately 0.02 wt % of a hydrocarbon surface active agent, and the like can be noted. Without using this composition, a solution including HF, $NH_4F$ and surface active agent, a solution including HF and surface active agent of which pH is 5 or more, preferably, 5.5 or more, a solution including HF and an organic solvent, a solution including HF and an organic acid, a solution including HF, surface active agent, and an organic solvent, a solution including HF, surface active agent, and an organic acid, or the like can be used. Note that the etching is performed at a room temperature for approximately 35 seconds.

As the substance having surface activity, an organic solvent, organic acid, surface active agent, and the like are noted as described. And a solution containing fluorine and one or plurality kinds of them and are used. The pH of an etchant including the surface activity is 5 or more, preferably, 5.5 or more.

Figure 1G:
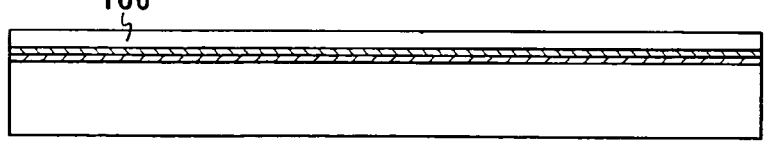

Accordingly, more preferable crystalline silicon film 106 can be obtained (FIG. 1G). In the case where a thin film transistor and a capacitor are manufactured using the crystalline silicon film, holes which have an adverse affect on properties of the thin film transistor and the capacity can be prevented.

This embodiment mode has a structure in which all the natural oxide film after laser irradiation, a natural oxide film 105 after gettering, and the etching stopper 103 are removed using an etchant composed of the solution containing fluorine and a substance having surface activity. However, the etchant may be used only in one or two of them.

It is because the segregation of element that promotes crystallization may occur in the both of the gettering site 104 and the crystalline silicon film 102, or either of the gettering site 104 or the crystalline silicon film 102 depending on the condition of heat treatment or concentration of the added element. Therefore, in some cases, it may be enough to apply an etchant of the solution containing fluorine and a substance having surface activity to either of the natural oxide film 105 or the etching stopper 103 according to the condition.

Embodiment Mode 2

In this embodiment mode, a method for manufacturing a thin film transistor and a capacitor according to the present invention is described with reference to FIG. 2A to 2D.

First, a small amount of impurities for controlling a threshold depending on necessity is doped in the crystalline silicon film 106 obtained in Embodiment Mode 1, which is also referred to as channel doping. In order to obtain the required threshold, boron, phosphorus, or the like is doped by ion doping or the like.

Figure 2A:
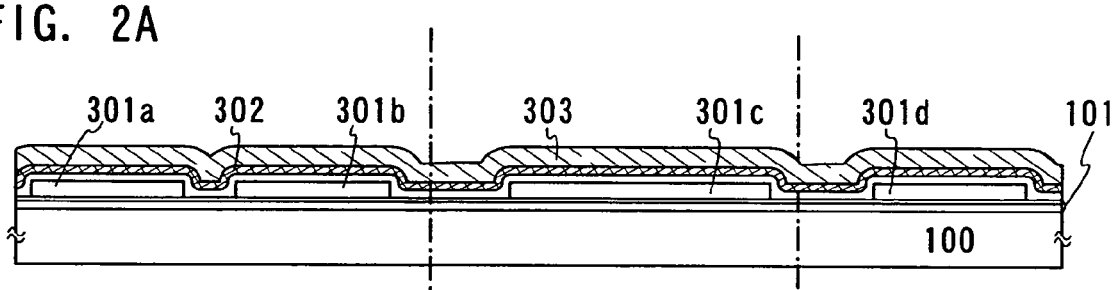
FIGS. 2A to 2D show Embodiment Mode 2.
Figure 2B:
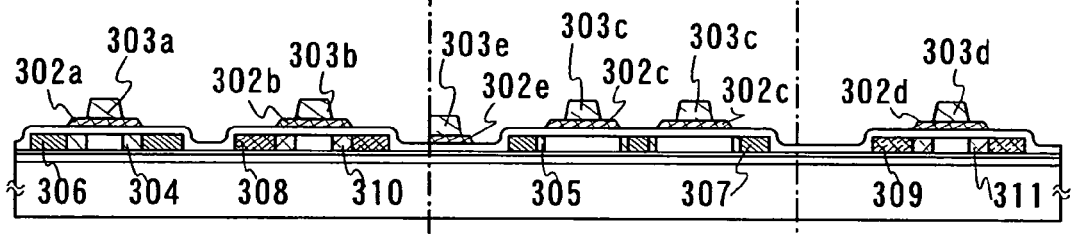
Figure 2C:
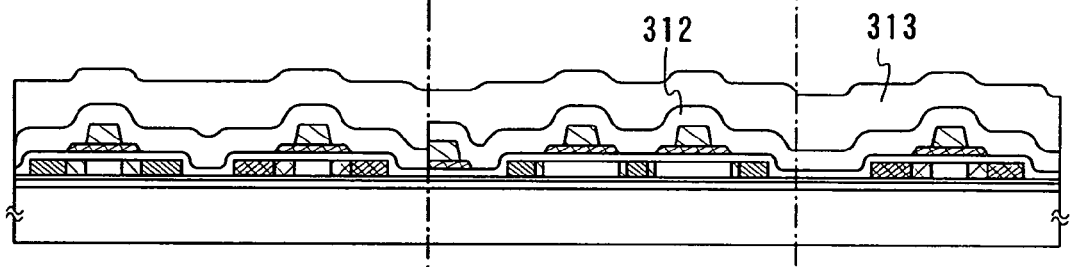
Figure 2D:
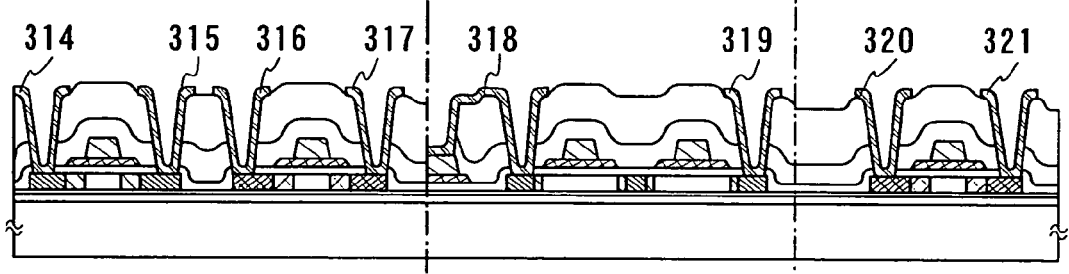

Then, crystalline silicon films $301a$ to $301d$ each having island shapes are obtained by patterning into predetermined shape as shown in FIG. 2A. The patterning is performed by applying a photoresist to the crystalline silicon film; exposing to be the predetermined mask shape; baking; forming a mask over the crystalline semiconductor film; and etching the crystalline silicon film using the mask by dry etching. $CF_4$, $O_2$, and the like are used as gases in dry etching.

Subsequently, a gate insulating film 300 is formed so as to cover the crystalline semiconductor films $301a$ to $301d$. The gate insulating film 300 is formed using an insulating film including silicon, with a film thickness of 40 nm to 150 nm, by plasma CVD or sputtering. In this embodiment mode, the gate insulating film 300 is formed using a silicon oxynitride film with a thickness of 115 nm by plasma CVD.

A natural oxide film (which is not shown and which is formed of silicon oxide) formed over the crystalline silicon film 102 may be etched using a solution containing fluorine and a substance having surface activity, and removed. Since the film quality of the natural oxide film can not be controlled, doping fluctuation may occur or the natural oxide film may not have properties that serves as an gate insulating film. Therefore, the natural oxide film is preferably removed before the steps when it is formed. When the solution containing fluorine and a substance having surface activity is used, even if there is segregation of nickel and/or nickel silicide in the lower layer crystalline silicon film 102, the natural oxide film formed of a silicon oxide film can be selectively etched, thereby preventing holes from being generated in the crystalline silicon film 102.

As an example of the solution containing fluorine and a substance having surface activity, a solution including approximately 0.3 wt % of HF, approximately 40 wt % of $NH_4F$, and approximately 0.01 to 0.1 wt % of a surface active agent; and a solution including approximately 0.1 wt % of HF, approximately 17 wt % of $NH_4F$, or approximately 0.01 to 0.1 wt % of a surface active agent can be noted. Without using this composition, a solution including HF, $NH_4F$, and a surface active agent; a solution including HF and a surface active agent of which pH is 5 or more, preferably pH 5.5 or more; a solution including HF and an organic solvent; a solution including HF and organic acid; a solution including HF, a surface active agent and an organic solvent; a solution including HF, a surface active agent, and organic acid, or the like can be used.

Note that etching is performed at a room temperature. And the processing time is properly decided by a practitioner according to the film quality and the film thickness of the oxide film.

As a substance having surface activity, an organic solvent, organic acid and a surface active agent are noted as described, and one kind of or a plurality of them are used. The pH of an etchant including the surface activity is preferably 5 or more, preferably, 5.5 or more.

A tantalum nitride (TaN) film 302 of 30 nm in thickness is formed as a first conductive layer on the gate insulating layer, and a tungsten (W) film 303 of 370 nm in thickness is formed thereon as a second conductive layer. Both of the TaN film and the W film may be formed by sputtering. The TaN film may be formed in nitrogen atmosphere by using Ta as a target, and the W film is formed by using W as a target.

Note that the first conductive layer is a TaN film of 30 nm in thickness and the second conductive layer is a W film of 370 nm in thickness in this embodiment mode; however, the first and second conductive layers may be formed of any element selected from Ta, W, Ti, Mo, Al, Cu, Cr, and Nd, or an alloy material or a compound material having the aforementioned element as a major component. Further, a semiconductor film represented by a polycrystalline silicon film into which an impurity element such as phosphorous is doped may be used. An AgPdCu alloy may be utilized as well. And a combination thereof may be selected in each case. The first conductive layer is formed to have a thickness of 20 nm to 100 nm, and the second conductive layer is formed to have a thickness of 100 nm to 400 nm. In this embodiment mode, a lamination structure of two layers is employed; however, a single layer structure, or three layers or more layers structure may be employed as well.

In order to form electrodes and wirings by etching the conductive layer, a resist is formed as a mask through exposure to light by photolithography. First etching is carried out under first and second etching conditions. Etching is carried out using the mask formed of a resist to form the gate electrodes and wirings. An etching condition may be determined in each case.

In the present method, ICP (Inductively Coupled Plasma) etching is used. As the first etching condition, $CF_4$, $Cl_2$, and $O_2$ are used as etching gases with the gas-flow ratio of 25/25/10 sccm, and an RF power of 500 W (13.56 MHz) is applied to the coil electrode under a pressure of 1.0 Pa to generate plasma for etching. An RF power of 150 W (13.56 MHz) is also applied to a substrate (sample stage) to apply a substantially negative self-bias voltage. The W film is etched under the first etching condition to make the edges of the first conductive layer into a tapered shape.

Subsequently, etching is carried out under the second etching condition. Etching is performed for about 15 seconds with the resist as a mask remained, by using $CF_4$ and $Cl_2$ as etching gases with the gas-flow ratio of 30/30 sccm, and an RF power of 500 W (13.56 MHz) is applied to the coil electrode under the pressure of 1.0 Pa to generate plasma for etching. An RF power of 20 W (13.56 MHz) is applied to a substrate (sample stage) to apply a substantially negative self-bias voltage. Under the second etching condition in which $CF_4$ and $Cl_2$ are mixed, both of the W film and the TaN film are etched to the same extent. Note that in order to perform etching without leaving residue on the gate insulating film, time required for etching may be increased by approximately 10% to 20%. The gate insulating film which is not covered with electrodes is etched by 20 nm to 50 nm in this first etching. The edges of the first and second conductive layers become tapered in the first etching due to the bias voltage applied to the substrate.

The second etching is carried out without removing the resist as a mask. The etching is performed for about 25 seconds using $SF_6$, $Cl_2$, and $O_2$ as etching gases with the gas-flow ratio of 24/12/24 sccm, and an RF power of 700 W (13.56 MHz) is applied to the coil electrode under the pressure of 1.3 Pa to generate plasma for etching. An RF power of 10 W (13.56 MHz) is applied to a substrate (sample stage) to apply a substantially negative self-bias voltage. The W film is selectively etched by this etching to form a conductive layer in a second shape. The first conductive layer is hardly etched at this time. Gate electrodes made of the first conductive layers $302a$ to $302d$ and the second conductive layers $303b$ to $303d$ are formed by the first and second etching.

The first doping is carried out without removing the resist as a mask. Thus, an n-type impurity is doped in a low concentration to a crystalline semiconductor layer. The first doping may be performed by ion doping or ion implantation. The ion doping may be performed with the dosage of $1 \times 10^{13}$ to $5 \times 10^{14}$ atoms/cm$^2$, and an acceleration voltage of 40 kV to 80 kV. The ion doping is carried out at an acceleration voltage of 50 kV in this embodiment mode. As the impurity element with an n-type, an element belonging to group 15 of the periodic table represented by phosphorous (P) or arsenic (As) is used. Phosphorous (P) is used in this embodiment mode. The first conductive layer is used as a mask, thereby, forming a first impurity region ($N^{--}$ region) to which an impurity of low concentration is doped, in a self-aligned manner.

Subsequently, the resist as the mask is removed. Then, a new mask formed of a resist is formed and the second doping is carried out at a higher acceleration voltage than that in the first doping. The n-type impurity is used in the second doping as well. The ion doping is performed with the dosage of $1\times10^{13}$ to $3\times10^{15}$ atoms/$cm^2$, and an acceleration voltage of 60 kV to 120 kV. The ion doping is carried out with the dosage of $3.0\times10^{15}$ atoms/$cm^2$ and an acceleration voltage of 65 kV in this embodiment mode. The second doping is carried out using the second conductive layer as the mask to the impurity element, so that the impurity element is doped into the semiconductor layer which is located below the first conductive layer.

By the second doping, a second impurity region ($N^-$ region) is formed in the part where the second conductive layer is not overlapped or the part which is not covered with the mask in the part where the crystalline semiconductor layer is overlapped with the first conductive layer. The n-type impurity is doped into the second impurity region for the concentration from $1\times10^{18}$ to $5\times10^{19}$ atoms/$cm^3$. Further, the n-type impurity is also doped into the crystalline semiconductor film which is not covered with either the first conductive layer nor the mask and exposed (third impurity region: $N^+$ region) for high concentration from $1\times10^{19}$ to $5\times10^{21}$ atoms/$cm^3$. The semiconductor layer has an $N^+$ region, a part of which is covered only with the mask. The concentration of the n-type impurity of this part is not changed from the impurity concentration of the first doping. Therefore, this part is referred to as the first impurity region ($N^{--}$ region) as it is.

Note that each impurity region is formed by doping treatments twice in this embodiment mode; however, the invention is not exclusively limited thereto. The impurity region having a desired impurity concentration may be formed by one or a multiple doping by setting the condition in each case.

Subsequently, the resist as a mask is removed and a new mask formed of a resist is formed for third doping. By the third doping, a fourth impurity region ($P^+$ region) and a fifth impurity region ($P^-$ region) are formed in which an impurity element having the opposite conductivity to those of the first and second conductive layers is added to the semiconductor layer which becomes a p-channel type TFT.

The fourth impurity region ($P^+$ region) is formed in the part which is not covered with the resist as a mask and not overlapped with the first conductive layer, and the fifth impurity region ($P^-$ region) is formed in the part which is not covered with the resist as a mask, overlapped with the first conductive layer, and not overlapped with the second conductive layer. As the p-type impurity element boron (B), aluminum (Al), or gallium (Ga), each of which belongs to the group 13 of the periodic table are known.

In this embodiment mode, boron (B) is used as a p-type impurity element to form the fourth and fifth impurity regions by ion doping using diborane ($B_2H_6$). The ion doping is carried out with the dosage of $1\times10^{16}$ atoms/$cm^2$ and an acceleration voltage of 80 kV.

Note that semiconductor layers for forming n-channel TFTs are covered with resists as masks in the third doping.

The fourth impurity region ($P^+$ region) and the fifth impurity region ($P^-$ region) are doped with phosphorous in different concentration by the first and second doping. However, in both of the fourth impurity region ($P^+$ region) and the fifth impurity region ($P^-$ region), the third doping is performed so that the concentration of the p-type impurity element is $1\times10^{19}$ atoms/$cm^2$ to $5\times10^{21}$ atoms/$cm^2$. Therefore, the fourth impurity region ($P^+$ region) and the fifth impurity region ($P^-$ region) serve as a source region and a drain region of a p-channel TFT without problems.

Note that the fourth impurity region ($P^+$ region) and the fifth impurity region ($P^-$ region) are formed by one time the third doping; however, the invention is not exclusively limited thereto. The fourth impurity region ($P^+$ region) and the fifth impurity region ($P^-$ region) may be formed by multiple doping treatments according to each condition.

By the aforementioned doping treatments, a first impurity region ($N^{--}$ region) 304, a second impurity region ($N^-$ region) 305, third impurity regions ($N^+$ region) 306 and 307, fourth impurity regions ($P^+$ region) 308 and 309, and fifth impurity regions ($P^-$ region) 310 and 311 are formed.

Subsequently, the resist as a mask is removed to form a first passivation film 312. As the first passivation film, an insulating film containing silicon is formed with thickness of 100 mm to 200 nm by plasma CVD or sputtering.

In this embodiment mode, a silicon oxide film including nitrogen is formed with thickness of 100 nm by plasma CVD. In the case of using the silicon oxide film including nitrogen, a silicon oxynitride film formed of $SiH_4$, $N_2O$, and $NH_3$ by plasma CVD, a silicon oxynitride film formed of $SiH_4$, and $N_2O$, or a silicon oxynitride film formed of a gas in which $SiH_4$ and $N_2O$ are diluted with Ar may be formed. Further, a silicon oxynitride hydride film formed of $SiH_4$, $N_2O$, and $H_2$ may be employed as the first passivation layer. It is needless to say that the first passivation film 312 is not limited to a single layer structure of the silicon oxynitride film as the one in this embodiment mode, and another insulating layer containing silicon may be utilized in a single or a laminated structure.

An interlayer insulating film 313 is formed on the first passivation 1 film 312. The interlayer insulating film may be an inorganic insulating film or an organic insulating film. The inorganic insulating film may be a silicon oxide film formed by CVD, a silicon oxide film applied by SOG (Spin On Glass). The organic insulating layer may be a film of polyimide, polyamide, BCB (benzocyclobutene), acryl, positive photosensitive organic resin, negative photosensitive organic resin, a material in which a skelton structure is formed of a combination of silicon and oxygen, and which at least includes hydrogen as a substituent or which includes one kind selected from fluorine, alkyl group, aromatic hydrocarbon namely as a film including siloxane, or the like is used. In addition, the laminated structure thereof is also used.

In this embodiment mode, the interlayer insulating film 313 is formed using siloxane. After polymer including siloxane is entirely applied as the interlayer insulating film, it is dried with heat treatment at 50° C. to 200° C. for 10 minutes, and further baked at 300° C. to 450° C. for 1 to 12 hours. The film including siloxane is entirely formed with a thickness of 1 µm by this baking. According to this step, the polymer including siloxane is baked, and at the same time, hydrogenation of a semiconductor layer and activation of an impurity can be performed by hydrogen in the first passivation film 312. Thus, the number of steps can be reduced and the process can be simplified. In the hydrogenation, a dangling bond of the semiconductor layer is terminated by using hydrogen included in the first passivation film 312.

In the case of forming the interlayer insulating film using the material other than siloxane, heat treatment is required to obtain hydrogenation and activation. In this case, the step of heat treatment is required to be performed before forming the interlayer insulating film. The heat treatment may be performed with oxygen concentration of 1 ppm or less, preferably 0.1 ppm or less, at 400° C. to 700° C. in nitrogen atmosphere. In this embodiment mode, heat treatment at 410° C. for 1 hour is performed for the activation. As the method other than the heat treatment, laser anneal or rapid thermal anneal (RTA) can be used.

Heat treatment may be carried out before forming the first passivation film 312. In the case where the material for constituting the first conductive layers 302a to 302d and the second conductive layers 303a to 303d are easily affected by heat, heat treatment is preferably performed after forming the first passivation film 312 so as to protect the wiring and the like as in this embodiment mode. In this case, hydrogenation using hydrogen included in the passivation film can not be performed since there is not the first passivation film. Therefore, plasma hydrogenation using hydrogen activated by plasma, or heat treatment at 300° C. to 450° C. for 1 to 12 hours in atmosphere including 3% to 100% hydrogen may be carried out for the hydrogenation.

Then, a silicon nitride oxide film or a silicon oxynitride film may be formed by CVD to cover the interlayer insulating film 313. This film functions as an etching stopper in the case of etching a conductive that is formed thereafter, and prevents the interlayer insulating film from being overetched. Further, a silicon nitride film may be formed thereover by sputtering. This silicon nitride film has a function of controlling the movement of alkali metal ion, thereby preventing the movement of the metal ion of lithium element, sodium or the like to the semiconductor thin film from a pixel electrode to be formed later.

Then, patterning and etching of the interlayer insulating film are performed, and contact holes which reach the crystalline semiconductor layers 301a to 301d are formed. The contact holes are formed by etching the film including siloxane by using a mixed gas of $CF_4$, $O_2$ and He, subsequently etching the silicon oxide film of a gate insulating film using a gas of $CHF_3$, and eliminating.

The surface of the crystalline silicon film 102 is exposed by forming the contact holes. Accordingly, there is a case that the natural oxide film is formed on the exposed surface (not shown). When the natural oxide film is formed, resistance between the wiring and the crystalline silicon film becomes high, and drive voltage may be increased and operation problem may be caused. Thus, the natural oxide film is preferably removed before forming the wiring.

The natural oxide film may be removed using a solution including fluorine and a substance having surface activity. Even if there is segregation of nickel and/or nickel silicide in the crystalline silicon film where contact holes are formed, the natural oxide film formed of a silicon oxide film can be selectively etched using this solution. Therefore, the holes are prevented from being generated in the crystalline silicon film.

As an example of the solution containing fluorine and a substance having surface activity, a solution including approximately 0.3 wt % of HF, approximately 40 wt % of $NH_4F$, and approximately 0.01 to 0.1 wt % of a surface active agent; and a solution including approximately 0.1 wt % of HF, approximately 17 wt % of $NH_4F$, or approximately 0.01 to 0.1 wt % of a surface active agent or the like can be noted. Without using this composition, a solution including HF, $NH_4F$ and a surface active agent; a solution including HF and a surface active agent of which pH is 5 or more, preferably pH is 5.5 or more; a solution including HF and an organic solvent; a solution including HF and organic acid; a solution including HF, a surface active agent and an organic solvent; a solution including HF, a surface active agent, and organic acid, or the like can be used. Note that etching is performed at a room temperature for 15 to 40 seconds.

Then, a metal film is laminated in the contact holes, and patterning is performed in order to form a source electrode and a drain electrode. In this embodiment mode, a titanium film including nitrogen element with a thickness of 100 nm, a titanium-aluminum alloy film with a thickness of 350 nm, and a titanium film with a thickness of 100 nm are laminated respectively. And patterning and etching are performed to obtain a desired shape, thereby forming a source electrode and/or drain electrodes 314 to 321 having a three layer structure.

The titanium film including a nitrogen element in the first layer uses titanium as a target, and is formed by sputtering with a flow rate of nitrogen and argon 1:1. When the titanium film including the nitrogen element as described is formed over an interlayer insulating film including siloxane, the film becomes hard to peel off, and wirings having lower resistance with a crystalline silicon film can be formed.

According to the present invention as described above, a thin film transistor and a capacitor can be manufactured. By forming the thin film transistor and the capacity as this embodiment mode, disadvantage of the natural oxide film can be eliminated, holes which have an adverse influence on properties of the crystalline silicon film having semiconductor properties can be prevented from being generated in the crystalline silicon film, reliability thereof can be improved, and the yield can be improved.

Note that this embodiment mode can be freely combined with Embodiment Mode 1. The step of removing the oxide film using a solution including fluorine and a substance having surface activity is performed before performing channel doping and before forming the source wiring and the drain wiring in this embodiment mode. However, the step may be performed in either of the cases.

This is because the segregation of an element that promotes crystallization, such as nickel may occur by the condition of heat treatment or concentration of the element which is added, or may not occur.

EXAMPLE 1

Figure 3A:
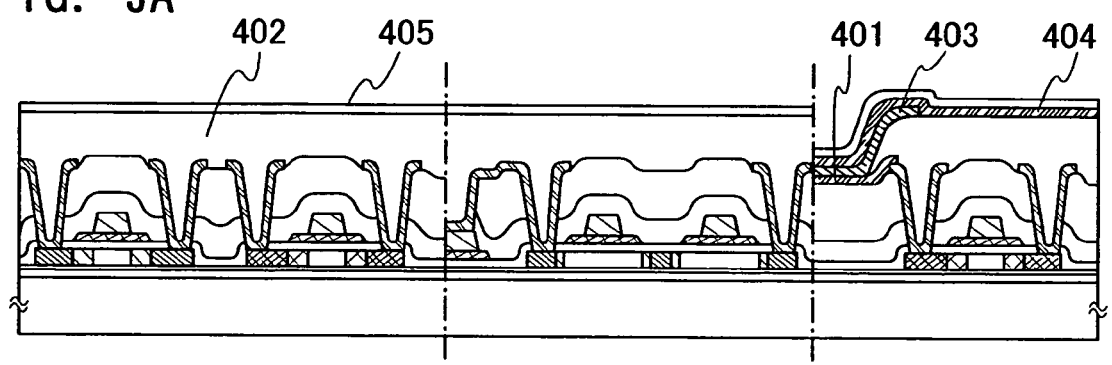
FIGS. 3A and 3B show Example 1.

In this example, an example of forming a light emitting device using a thin film transistor and a capacitor manufactured according to the present invention is described with reference to FIG. 3.

In the light emitting device described in this example, a layer including a substance which emits light is sandwiched between a pair of electrodes, and an element which emits light by flowing current between the electrodes is arranged in a matrix form. It is assumed that emission mechanism of a light emitting element is as follows: by applying voltage between a pair of electrodes while sandwiching an organic compound layer therebetween, electron injected from a cathode and a hole injected from an anode are recombined at the center of the light emission to form a molecular exciton, and energy is discharged to emit light when the molecular exciton returns to the ground state.

The excitation state is known to include a singlet excitation and a triplet excitation, and it is thought that the light emission can be obtained through either of the excitation states. Therefore, the elements in the state of both of the singlet excitation state and triplet excitation state may be mixed in one light emitting device depending on the properties of the element. For example, in three color of RGB, an element of triplet excitation state may be used in red, and an element of singlet excitation state may be used in blue and green. Further, the element of triplet excitation state generally has preferable luminous efficiency, thereby contributing to the decrease of the driving voltage.

As the material for the light emitting element, there are a low-molecular weight organic compound material, a high-molecular weight organic compound material, and a medium-molecular weight organic compound material that has a property between the low-molecular weight organic compound material and the high-molecular weight organic compound material. In this example, since an electroluminescent layer is formed by vapor deposition, a low-molecular weight organic compound material is used. The high-molecular weight organic compound material is dissolved in a solvent and can be applied by spin coating or ink jetting. Further, not only the organic material but also a composite material of the organic material and an inorganic material can be used.

A first electrode 401 of a light emitting element is formed so as to be overlapped with one part of the drain electrode of the thin film transistor manufactured in Embodiment Mode 2. The first electrode serves as an anode or a cathode of a light emitting element. In the case of using it as the anode, a metal with a large work function, alloy, electrically conductive compound, the mixture of those, or the like are preferably used. The work function of approximately 4.0 eV or more is to be an indication of the work function. As the specific material, ITO (indium tin oxide), IZO (indium zinc oxide) in which 2% to 20% of zinc oxide (ZnO) is mixed in the indium oxide, ITSO in which 2% to 20% of silicon oxide ($SiO_2$) is mixed into indium oxide, gold (Au), platinum (Pt), nickel (Ni), tungsten (W), chrome (Cr). molybdenum (Mo), iron (Fe), cobalt (Co), copper (Cu), palladium (Pd), and titanium nitride (TiN) of a metal material, and the like can be used.

On the other hand, it is preferable to use a metal, an alloy, a conductive compound, a mixture thereof, or the like having a small work function (work function of 3.8 eV or less) as an electrode material used for the cathode. An element belonging to group 1 or 2 in the periodic table, that is, alkaline metal such as Li or Cs, alkaline earth metal such as Mg, Ca, or Sr, an alloy (Mg:Ag or Al:Li) or a compound (LiF, CsF, or $CaF_2$) including them, or a transition metal including a rare-earth metal can be used as a specific material. However, in this example, the second electrode is light-transmitting, and therefore the metal or the alloy including the metal is formed extremely thinly, and the second electrode can be formed by laminating ITO, IZO, ITSO, or another metal (including alloy).

In this example, the first electrode 401 is used as an anode, and ITSO is used. When the ITSO is used as an electrode, the reliability of the light emitting device is improved by vacuum baking.

In this example, the first electrode is formed after manufacturing a source electrode and a drain electrode of a thin film transistor, however, the first electrode may be formed first, and the electrodes of the thin film transistor may be manufactured.

An insulating film 402 is formed so as to cover the edge portion of the first electrode 401 that serves as a pixel electrode connected to the thin film transistor of a pixel portion. The insulating film 402 is referred to as a bank or a partition wall. An inorganic insulating film or an organic insulating film can be used as an insulating film 402. As the inorganic insulating film, a silicon oxide film formed by CVD, a silicon oxide film formed by SOG (Spin On Glass), or the like can be used. As the organic insulating film, photosensitive or non-photosensitive polyimide, polyamide, BCB (benzocyclobutene), acryl or positive type photosensitive organic resin, negative type photosensitive organic resin, or a material in which skeleton structure is composed by combination of silicon and oxide, and at least hydrogen is included in the substituent or at least one kind of fluorine, alkyl group, and aromatic hydrocarbon is included in the substituent, namely a film including silixane can be used. Furthermore, the laminated structure of them may be used. When the insulating film 402 is formed using a photosensitive organic material, the opening has a shape that curvature radius is sequentially varied. Thus, it is preferable since disconnection of the film hardly occur when the electroluminescent layer is deposited. In this example, photosensitive polyimide is used.

Subsequently, the deposition is performed while moving an evaporation source. For example, deposition is performed in a film formation chamber which is evacuated to the degree of $5 \times 10^{-3}$ Torr (0.665 Pa) or less, preferably, $10^{-4} \times 10^{-6}$ Torr. During the deposition, the organic compound is evaporated by the resistance heat in advance, and scattered to the direction of the substrate by opening a shutter. The evaporated organic compound is scattered upward, and deposited over the substrate through an opening provided for a metal mask. Accordingly, an electroluminescent layer 403 (from the side of the first electrode: a hole injection layer, a hole transporting layer, a light emitting layer, an electron transporting layer, an electron injection layer) is formed. Note that the electroluminescent layer 403 may be a single layer structure or a mixed layer structure instead of such a laminated structure.

After the electroluminescent layer 403 is formed, a second electrode 404 is is formed so as to be in contact with the electroluminescent layer 403. In this example, since the first electrode 401 serves as an anode, the second electrode 404 is formed to be a cathode. A material as stated previously may be used as a material of the cathode. In this example, after a material including Li is formed thinly, ITSO is formed by sputtering, thereby forming a second electrode (cathode) 404 having a light-transmitting property.

In this embodiment, both the first electrode 401 and the second electrode 404 are formed of a light-transmitting material. Thus, light can be taken from both top and bottom sides of the substrate. Needless to say, a light-transmitting property of either of the electrodes can be controlled. And light emitting can be obtained only from the top surface or the bottom surface according to the material which is used closer to the substrate side from the electroluminescent layer.

Figure 3B:
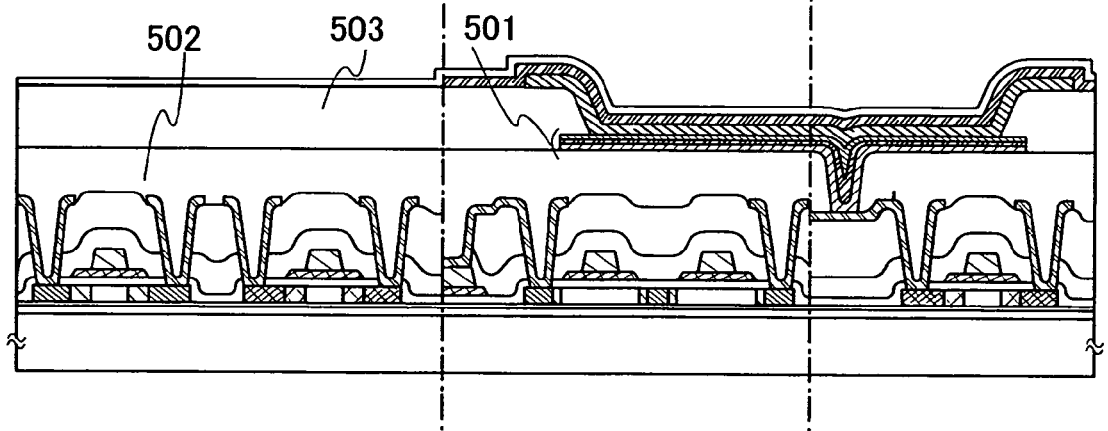

FIG. 3B is an example of a top-emission structure, in which the pixel electrode 501 and an electrode of a thin film transistor are formed in different layers. The first interlayer insulating film 502 and the second interlayer insulating film 503 are manufactured using a material that is the same as the material for the interlayer insulating film 313 in FIG. 2, and the combination can be freely selected, however, both of the layers including siloxane in this case. The pixel electrode 501 is formed by laminating Al—Si, TiN, ITSO from the side of the second interlayer insulating film 503, it is sure that it may be a single layer or a laminated structure having two layers, four layers or more.

When the second electrode 404 is formed by sputtering, the surface of the electron injection layer or the interface of the electron injection layer and the electron transporting layer may be damaged from the sputtering. This may cause an adverse effect on the properties. In order to prevent the problem, a material which is hardly affected by the damage is preferably provided at the closest side of the second electrode 404. MoOx can be noted as a material that can be used as the electroluminescent layer 403, which is hardly damaged from sputtering. However, since the MoOx is a preferable substance for the hole injection layer, the second electrode 404 is required to be used as the anode so as to be provided in contact with the second electrode 404.

In this case, it is necessary that the first electrode 401 is used as a cathode; an electron injection layer; an electron transporting layer; a light emitting layer; a hole transporting layer; a hole injection layer (MoOx), and a second electrode (anode) are sequentially formed in this order, and a thin film transistor for driving a pixel is an a n-channel type. MoOx is formed by vapor deposition, x=3 or more than 3 is preferably applied thereto.

After that, a silicon oxide film containing nitrogen is formed as a second passivation film 405 by plasma CVD. In the case of using a silicon oxide film containing nitrogen, a silicon oxynitride film formed of $SiH_4$, $N_2O$, and $NH_3$ by plasma CVD, a silicon oxynitride film formed of $SiH_4$ and $N_2O$, or a silicon oxynitride film formed of the gas in which $SiH_4$ and $N_2O$ are diluted with Ar is preferably formed. Further, a hydrogenated silicon oxynitride film formed of $SiH_4$ and $N_2O$, and $H_2$ may be used as the first passivation film. It is needless to say that the second passivation film 405 is not limited a single layer structure, and a single layer or a laminated structure of other insulating films containing silicon may be used as well. Moreover, a silicon nitride film or a diamond-like carbon film may be formed instead of the silicon oxide film containing nitrogen.

Subsequently an counter substrate is affixed by a sealing agent. The space between the counter substrate and an element substrate may be filled with an inert gas such as dried nitrogen, or a sealing agent may be applied on entire surface of the pixel portion, in order to form the counter substrate. It is preferable to use ultraviolet curing resin and the like for the sealing agent. The sealing agent may be mixed with a drying agent or particles for maintaining a gap between the substrates uniform.

As described above, a light emitting device can be formed using a thin film transistor manufactured according to the present invention. In the light emitting element manufactured according to the invention, holes are prevented from being generated in a crystalline silicon film that is a semiconductor layer. Thus the reliability and yield are preferable. As a result, a light emitting device which is excellent in the reliability, the yield and the cost can be obtained.

EXAMPLE 2

In this example, gettering is performed on a crystalline silicon film which is crystallized using an element that promotes crystallization. Each of the results of the measurement in the gate leakage current when an etching stopper film, which is the next step to be performed, is removed using an etchant having surface active agent or removed using an etchant not having surface active agent is shown. The measurement is performed using a capacitor TEG (test element group) of an insulating film (a silicon oxide film in which nitrogen is added) with a thickness of 110 nm and an area of 1 mm² in a state that gate voltage of 30 V is applied.

Figure 4:
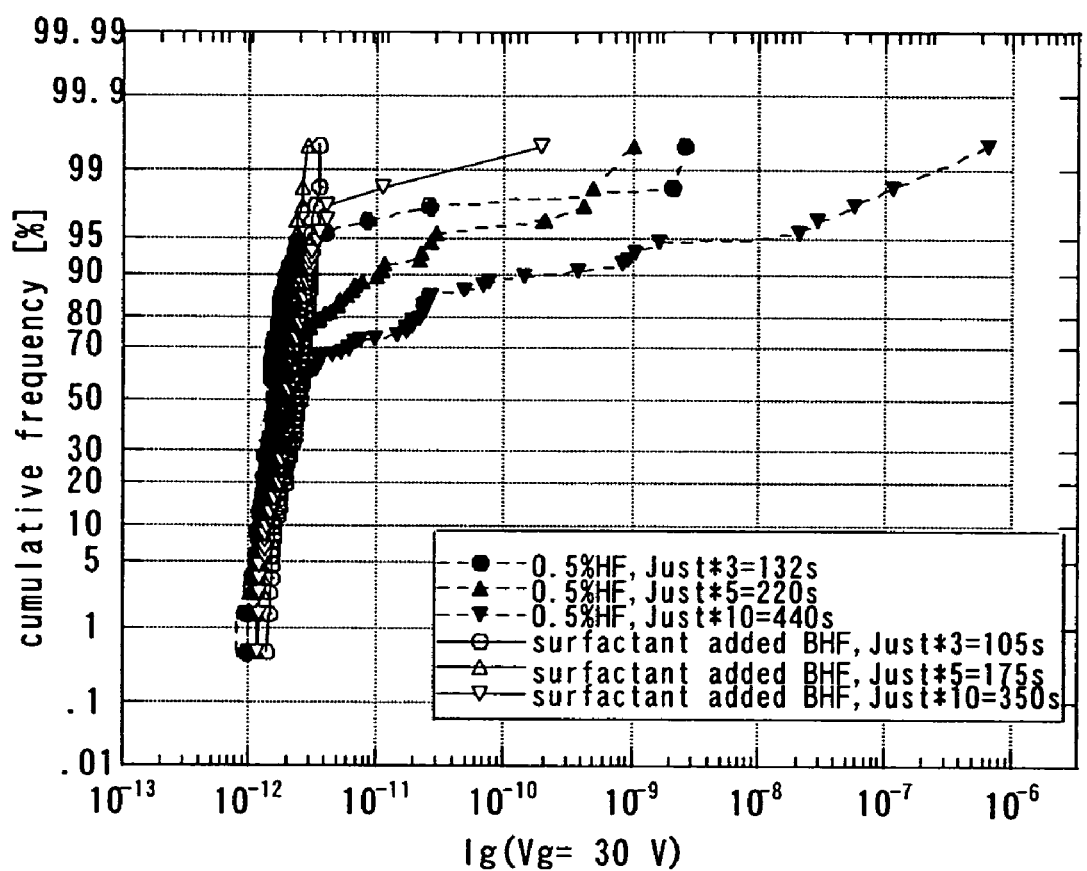
FIG. 4 shows measurement data of a gate leakage current.
Figure 5:
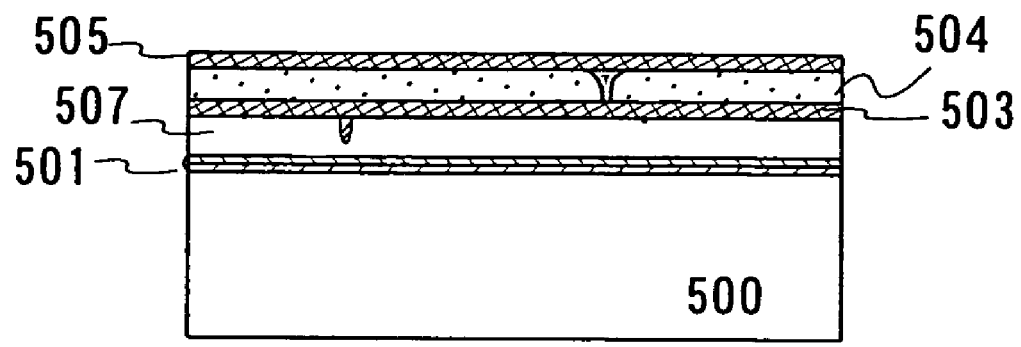
FIG. 5 shows a diagram of a prior art.

FIG. 4 is a normal probability distribution diagram. In the diagram, plots of ○ and ● are those over etched for three-times , plots of Δ and ▲ are those over etched for five-times, and ∇ and ▼ are those over etched for ten-times. A broken line indicates the one not added with a surface active agent, and a continuous line indicates the one added with a surface active agent.

Further, the vertical axis indicates a cumulative frequency, and a horizontal axis indicates a gate leakage current Ig. The leakage current is preferably small, and in the condition not having a trouble, distribution close to normal distribution in concentrating around a certain value is shown.

FIG. 4 shows that there are a large number of large gate leakage currents in samples which are etched without surface active agent, which clearly shows an abnormal values. According to the increase of the etching time, it can be seen that degree and frequency of the abnormal value are increased. On the other hand, in the case of performing etching by using surface active agent, those over etched for three times or five times indicates close to normal distribution, and even those over etched for ten times indicates almost normal distribution, and a there are few of them that indicates an abnormal values, and also the degree is small.

By etching according to the present invention, a situation where occurrence of damaged semiconductor element to a large degree can be prevented, and an element having preferable properties can be manufactured with high yield.

EXAMPLE 3

Examples of electronic devices to which the present invention is applied can be given as a camera such as a video or digital camera, a goggle type display (head mounted display), a navigation system, an audio reproducing device (car audio, an audio component, or the like), a personal computer, a game machine, a personal digital assistant (a mobile computer, a cellular phone, a portable game machine, an electronic book, or the like), and an image reproducing device including a recording medium (specifically, a device capable of processing data in a recording medium such as a Digital Versatile Disk (DVD) and having a display that can display the image of the data). Practical examples of these electronic devices are shown in FIGS. 6A to 6E.

Figure 6A:
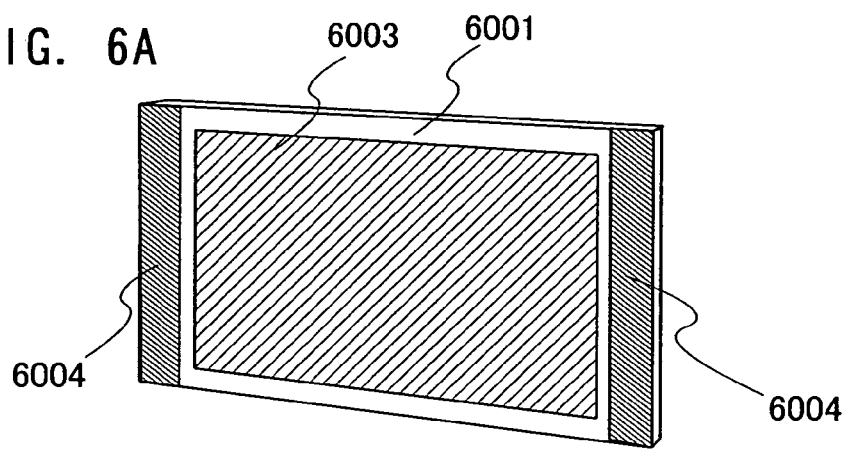
FIGS. 6A to 6E show examples of electronic devices.

FIG. 6A shows a wall-mounted display device, which includes a chassis 6001, a display portion 6003, a speaker portion 6004, and the like. The present invention is applied to manufacturing of the display portion 6003. Low-cost and high-reliable device can be obtained by employing the present invention.

Figure 6B:
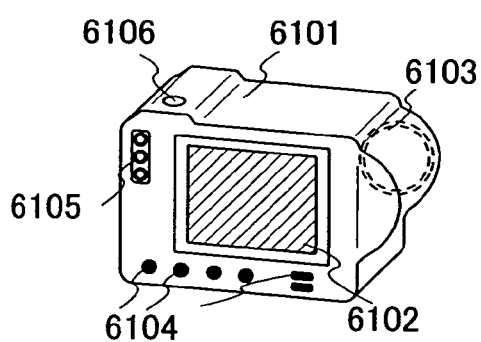

FIG. 6B shows a digital still camera, which includes a main body 6101, a display portion 6102, an image receiving portion 6103, operation keys 6104, an external connection port 6105, a shutter 6106, and the like. The present invention can be applied to the display portion 6102. Low-cost and high-reliable camera can be obtained by employing the present invention.

Figure 6C:
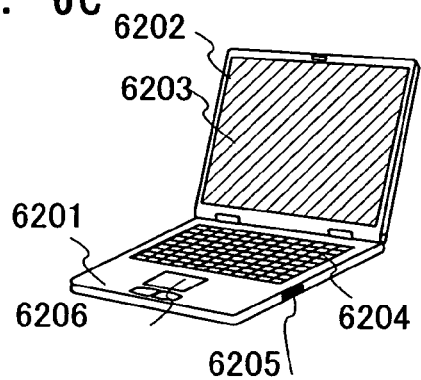

FIG. 6C shows a laptop personal computer, which includes a main body 6201, a chassis 6202, a display portion 6203, a keyboard 6204, an external connection port 6205, a pointing mouse 6206, and the like. The present invention can be applied to the display portion 6203. Low-cost and high-reliable device can be obtained by employing the present invention.

Figure 6D:
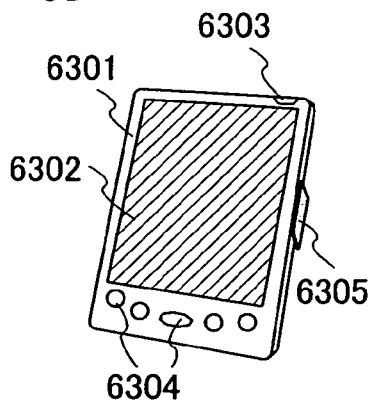
Figure 6E:
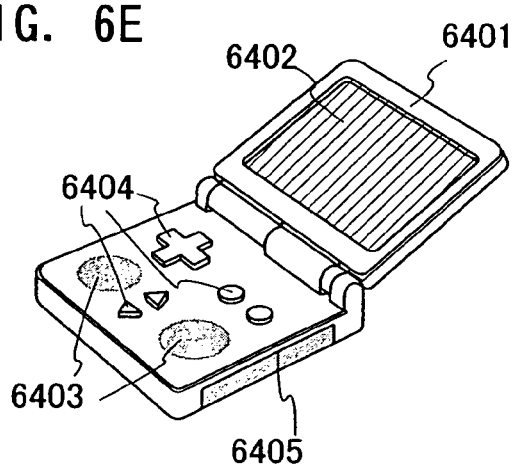

FIG. 6D shows a mobile computer, which includes a main body 6301, a display portion 6302, a switch 6303, operation keys 6304, an infrared port 6305, and the like. The present invention can be applied to the display portion 6302. Low-cost and high-reliable personal computer can be obtained by employing the present invention. FIG. 6E shows a portable game machine, which includes a chassis 6401, a display portion 6402, a speaker portion 6403, operation keys 6404, a recording medium insertion portion 6405, and the like. The present invention can be applied to the display portion 6402. Low-cost and high-reliable game machine can be obtained by employing the present invention.

As described above, the applicable range of the present invention is so wide that the invention can be applied to electronic devices of various fields. In addition, reliability of a product improves, so that reliability as a manufacturer can also be improved.

This application is based on Japanese Patent Application serial no. 2003-431369 filed in Japan Patent Office on Dec. 25 in 2003 the contents of which are hereby incorporated by reference.

In addition, in this embodiment modes and the examples of the prevent invention, the silicon film is used, however the present invention is not limited thereto. The prevent invention may be performed with a semiconductor film including silicon or other semiconductor films.

What is claimed is:

1. A method for manufacturing a semiconductor device comprising the steps of:
   forming a first silicon oxide film over a first crystalline semiconductor film crystallized by using an element that promotes crystallization, the first crystalline semiconductor film comprising silicon;
   forming a second semiconductor film comprising amorphous silicon over the first silicon oxide film;
   performing a heat treatment wherein a second silicon oxide film is formed on the second semiconductor film; and
   removing the second silicon oxide film by using a solution containing fluorine and a substance having surface activity.

2. A method for manufacturing a semiconductor device comprising the steps of:
   irradiating a first crystalline semiconductor film crystallized by using an element that promotes crystallization with laser light, the first crystalline semiconductor film comprising silicon;
   removing a first silicon oxide film formed on the surface of the first crystalline semiconductor film with the irradiation of the laser light by using a solution containing fluorine and a substance showing having surface activity;
   forming a second silicon oxide film over the first crystalline semiconductor film;
   forming a second semiconductor film comprising amorphous silicon over the second silicon oxide film;
   performing a heat treatment wherein a third silicon oxide film is formed on the second semiconductor film; and
   removing the third silicon oxide film by using a solution containing fluorine and a substance having surface activity.

3. A method for manufacturing a semiconductor device comprising the steps of:
   forming a first silicon oxide film over a first crystalline semiconductor film crystallized by using an element that promotes crystallization, the first crystalline semiconductor film comprising silicon;
   forming a second semiconductor film comprising amorphous silicon over the first silicon oxide film;
   performing a heat treatment wherein a second silicon oxide film is formed on the second semiconductor film; and
   removing the second silicon oxide film by using a solution containing fluorine and a substance having surface activity;
   removing the second semiconductor film; and
   removing the first silicon oxide film formed over the first crystalline semiconductor film by using a solution containing fluorine and a substance having surface activity.

4. A method for manufacturing a semiconductor device comprising the steps of:
   irradiating a first crystalline semiconductor film crystallized by using an element that promotes crystallization with laser light, the first crystalline semiconductor film comprising silicon;
   removing a first silicon oxide film formed on the surface of the first crystalline semiconductor film with the irradiation of the laser light by using a solution containing fluorine and a substance having surface activity;
   forming a second silicon oxide film over the first crystalline semiconductor film;
   forming a second semiconductor film comprising amorphous silicon over the second silicon oxide film;
   performing a heat treatment wherein a third silicon oxide film is formed on the second semiconductor film; and
   removing the third silicon oxide film by using a solution containing fluorine and a substance having surface activity;
   removing the second semiconductor film; and removing the second silicon oxide film formed over the first crystalline semiconductor film by using a solution containing fluorine and a substance having surface activity.

5. The method for manufacturing a semiconductor device according to claim 1, wherein the substance having surface activity is one or more kinds of organic solvent, organic acid, and a surface active agent.

6. The method for manufacturing a semiconductor device according to claim 2, wherein the substance having surface activity is one or more kinds of organic solvent, organic acid, and a surface active agent.

7. The method for manufacturing a semiconductor device according to claim 3, wherein the substance having surface activity is one or more kinds of organic solvent, organic acid, and a surface active agent.

8. The method for manufacturing a semiconductor device according to claim 4, wherein the substance having surface activity is one or more kinds of organic solvent, organic acid, and a surface active agent.

9. The method for manufacturing a semiconductor device according to claim 1, wherein the solution containing fluorine is a solution at least containing hydrofluoric acid.

10. The method for manufacturing a semiconductor device according to claim 2, wherein the solution containing fluorine is a solution at least containing hydrofluoric acid.

11. The method for manufacturing a semiconductor device according to claim 3, wherein the solution containing fluorine is a solution at least containing hydrofluoric acid.

12. The method for manufacturing a semiconductor device according to claim 4, wherein the solution containing fluorine is a solution at least containing hydrofluoric acid.

13. The method for manufacturing a semiconductor device according to claim 1, wherein the solution containing fluorine is a solution at least containing hydrofluoric acid and ammonium fluoride.

14. The method for manufacturing a semiconductor device according to claim 2, wherein the solution containing fluorine is a solution at least containing hydrofluoric acid and ammonium fluoride.

15. The method for manufacturing a semiconductor device according to claim 3, wherein the solution containing fluorine is a solution at least containing hydrofluoric acid and ammonium fluoride.

16. The method for manufacturing a semiconductor device according to claim 4, wherein the solution containing fluorine is a solution at least containing hydrofluoric acid and ammonium fluoride.

17. The method for manufacturing a semiconductor device according to claim 1, wherein the pH of the solution containing fluorine and surface active agent is 5 or more.

18. The method for manufacturing a semiconductor device according to claim 2, wherein the pH of the solution containing fluorine and surface active agent is 5 or more.

19. The method for manufacturing a semiconductor device according to claim 3, wherein the pH of solution containing fluorine and surface active agent is 5 or more.

20. The method for manufacturing a semiconductor device according to claim 4, wherein the pH of the solution containing fluorine and surface active agent is 5 or more.

21. The method for manufacturing a semiconductor device according to claim 1, wherein the pH of the solution containing fluorine and surface active agent is 5.5 or more.

22. The method for manufacturing a semiconductor device according to claim 2, wherein the pH of the solution containing fluorine and surface active agent is 5.5 or more.

23. The method for manufacturing a semiconductor device according to claim 3, wherein the pH of the solution containing fluorine and surface active agent is 5.5 or more.

24. The method for manufacturing a semiconductor device according to claim 4, wherein the pH of the solution containing fluorine and surface active agent is 5.5 or more.

25. The method for manufacturing a semiconductor device according to claim 1, wherein the semiconductor device is incorporated into an electronic device selected from the group consisting of a display device, a camera, a computer, a portable information terminal, and a game apparatus.

26. The method for manufacturing a semiconductor device according to claim 2, wherein the semiconductor device is incorporated into an electronic device selected from the group consisting of a display device, a camera, a computer, a portable information terminal, and a game apparatus.

27. The method of manufacturing a semiconductor device according to claim 3, wherein the semiconductor device is incorporated into an electronic device selected from the group consisting of a display device, a camera, a computer, a portable information terminal, and a game apparatus.

28. The method for manufacturing a semiconductor device according to claim 4, wherein the semiconductor device is incorporated into an electronic device selected from the group consisting of a display device, a camera, a computer, a portable information terminal, and a game apparatus.

* * * * *